(12) United States Patent
Oshima et al.

(10) Patent No.: US 11,139,700 B2
(45) Date of Patent: Oct. 5, 2021

(54) LEAKAGE DETECTOR, WIRELESS POWER TRANSMITTING DEVICE, WIRELESS POWER RECEIVING DEVICE, AND WIRELESS POWER TRANSMISSION SYSTEM

(71) Applicant: TDK CORPORATION, Tokyo (JP)

(72) Inventors: Kazunori Oshima, Tokyo (JP); Masahide Ohnishi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 538 days.

(21) Appl. No.: 16/015,883

(22) Filed: Jun. 22, 2018

(65) Prior Publication Data
US 2018/0375387 A1  Dec. 27, 2018

(30) Foreign Application Priority Data

Jun. 23, 2017 (JP) .............................. JP2017-122955
May 28, 2018 (JP) .............................. JP2018-101591

(51) Int. Cl.
*H02J 50/70* (2016.01)
*H02J 50/12* (2016.01)
*G01R 31/40* (2020.01)
*G01R 31/52* (2020.01)
*H02J 7/02* (2016.01)

(52) U.S. Cl.
CPC .............. *H02J 50/70* (2016.02); *G01R 31/40* (2013.01); *G01R 31/52* (2020.01); *H02J 50/12* (2016.02); *H02J 7/025* (2013.01)

(58) Field of Classification Search
CPC .............. H02J 50/00; H02J 50/70; H04B 5/00
See application file for complete search history.

(56) References Cited

FOREIGN PATENT DOCUMENTS

JP   2010109267 A   5/2010

*Primary Examiner* — Adi Amrany
(74) *Attorney, Agent, or Firm* — Young Law Firm, P.C.

(57) ABSTRACT

Disclosed herein is a leakage detector provided in a device having a conversion circuit that converts a DC voltage and an AC voltage from one to the other and a grounded metal member. The leakage detector comprises: an average voltage detection circuit that detects the average voltage of voltages corresponding to a potential difference between a high-voltage-side terminal or a low-voltage-side terminal on the DC side of the conversion circuit and the metal member; and a leakage detection circuit that detects the presence/absence of a leakage based on the average voltage detected by the average voltage detection circuit.

22 Claims, 6 Drawing Sheets

LEAKAGE DETECTOR, WIRELESS POWER TRANSMITTING DEVICE, WIRELESS POWER RECEIVING DEVICE, AND WIRELESS POWER TRANSMISSION SYSTEM

BACKGROUND OF THE INVENTION

Field of the Invention

The present invention relates to a leakage detector, a wireless power transmitting device, a wireless power receiving device, and a wireless power transmission system.

Description of Related Art

A wireless power transmission system that wirelessly transmits power from a power transmitting coil to a power receiving coil without using a power cable is now attracting attention.

A wireless power transmission system includes a wireless power transmitting device having a power transmitting coil and a wireless power receiving device having a power receiving coil. In each of these devices, various components and internal units are connected via cables. When an electric leakage occurs at the connection point, the wireless power transmission system may undergo a secondary fault. Thus, a leakage, if any, needs to be detected immediately.

JP 2012-217246 A discloses a ground fault detection circuit that detects an electric leakage (ground fault) between a power line used for supplying a DC voltage from a rectifying/smoothing circuit in a power receiving adapter to a charge controller and a ground line.

However, there is a fear that the technology disclosed in JP 2012-217246 A cannot detect the leakage accurately. That is, generally, a noise component is inevitably superimposed to a voltage to be applied to a power line which is a leakage detection target. The superposition of noise component changes a potential difference between the power line and the ground line and, thus, whether or not there is a leakage cannot be detected accurately only by simply monitoring the potential difference.

SUMMARY

The present invention has been made in view of the above problem, and the object thereof is to provide a leakage detector, a wireless power transmitting device, a wireless power receiving device, and a wireless power transmission system capable of detecting a leakage with high accuracy.

According to the present invention, there is provided a leakage detector provided in a device having a conversion circuit that converts a DC voltage and an AC voltage from one to the other and a grounded metal member. The leakage detector includes an average voltage detection circuit that detects the average voltage of voltages corresponding to a potential difference between a high-voltage-side terminal or a low-voltage-side terminal on the DC side of the conversion circuit and the metal member and a leakage detection circuit that detects the presence/absence of a leakage based on the average voltage detected by the average voltage detection circuit.

According to the present invention, there is further provided a wireless power transmitting device that includes anyone of the above leakage detectors, a drive circuit serving as the conversion circuit that converts a DC voltage into an AC voltage, the metal member, a power transmitting coil that generates an AC magnetic field based on the AC voltage supplied from the drive circuit, and a control circuit that stops the operation of the drive circuit in response to the detection of the leakage by the leakage detection circuit.

According to the present invention, there is still further provided a wireless power transmitting device that includes any one of the above leakage detectors, a drive circuit serving as the conversion circuit that converts a DC voltage into an AC voltage, the metal member, a power transmitting coil that generates an AC magnetic field based on the AC voltage supplied from the drive circuit, and an alarm that executes notification to a user or an external device in response to the detection of the leakage by the leakage detection circuit.

According to the present invention, there is still further provided a wireless power receiving device that includes any one of the above leakage detectors, a power receiving coil that receives an AC magnetic field and generates an AC voltage based on the AC magnetic field, a rectifying circuit serving as the conversion circuit that converts the AC voltage generated by the power receiving coil into a DC voltage, the metal member, and a transmitter that transmits, in response to the detection of the leakage by the leakage detection circuit, a stop signal for urging a wireless power transmitting device that generates the AC magnetic field to stop its power transmission operation.

According to the present invention, there is still further provided a wireless power receiving device that includes any one of the above leakage detectors, a power receiving coil that receives an AC magnetic field and generates an AC voltage based on the AC magnetic field, a rectifying circuit serving as the conversion circuit that converts the AC voltage generated by the power receiving coil into a DC voltage, the metal member, and an alarm that executes notification to a user or an external device in response to the detection of the leakage by the leakage detection circuit.

According to the present invention, there is still further provided a wireless power transmission system that includes a wireless power transmitting device and a wireless power receiving device, wherein the wireless power transmitting device is any one of the above wireless power transmitting devices.

According to the present invention, there is still further provided a wireless power transmission system that includes a wireless power transmitting device and a wireless power receiving device, wherein the wireless power receiving device is any one of the above wireless power receiving devices.

According to the present invention, there is still further provided a wireless power transmission system that includes a wireless power transmitting device and a wireless power receiving device, wherein the wireless power transmitting device is any one of the above wireless power transmitting devices, and the wireless power receiving device is any one of the above wireless power receiving devices.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Figure 1:
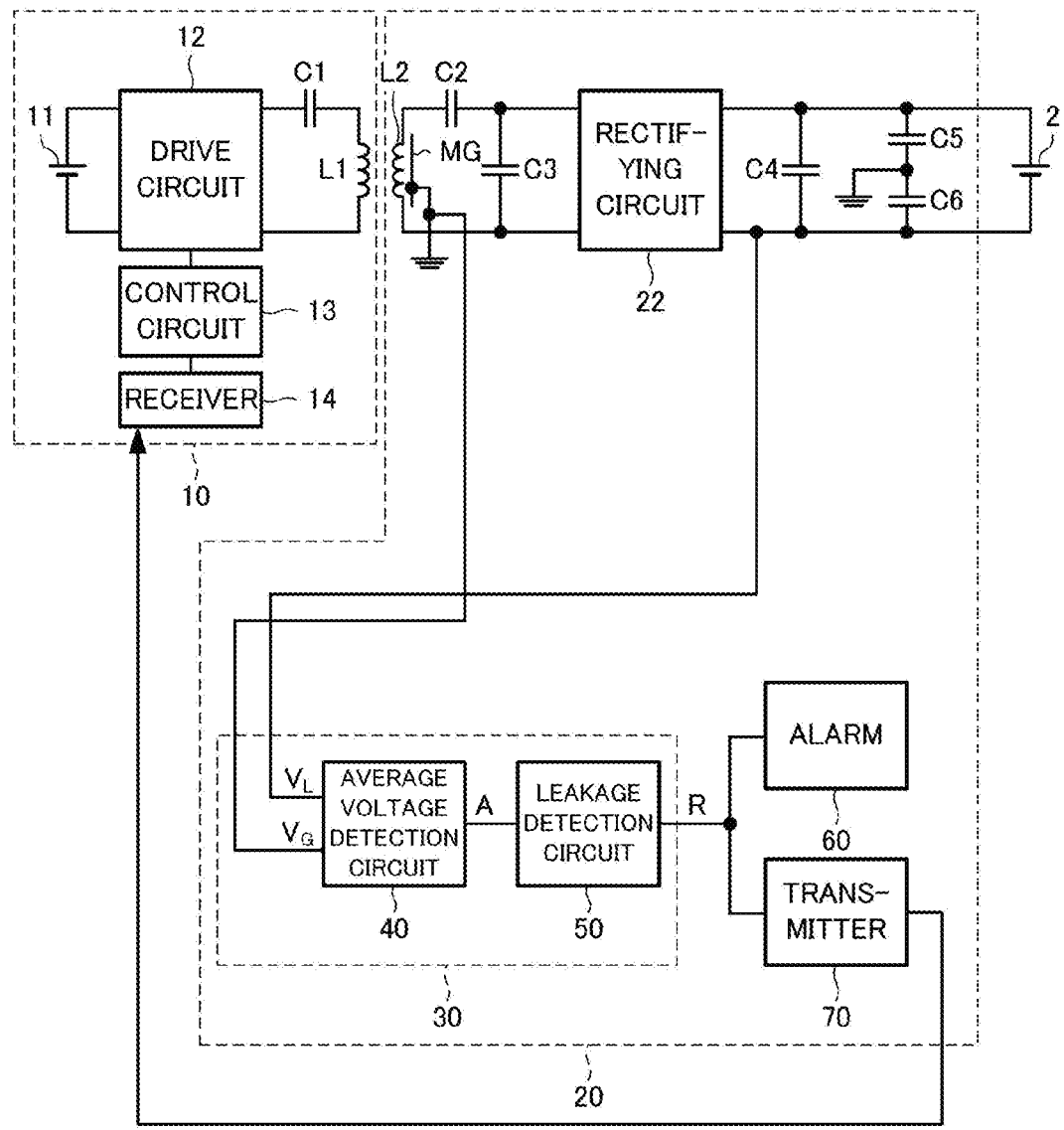
FIG. 1 is a view illustrating the configuration of a wireless power transmission system 1 according to a first embodiment of the present invention and a load 2 connected to the wireless power transmission system 1.

Hereinafter, with reference to the accompanying drawings, embodiments of the present invention will be described in detail. It should be noted that the present invention is not limited to the following embodiments. Further, the constituent elements described below include those that a person skilled in the art could readily conceive of, and those substantially identical thereto. Further, throughout the description, the same reference numerals are given to the same elements or elements having the same functions, and repeated description will be omitted.

FIG. 1 is a view illustrating the configuration of a wireless power transmission system 1 according to a first embodiment of the present invention and a load 2 connected to the wireless power transmission system 1. As illustrated in FIG. 1, the wireless power transmission system 1 includes a wireless power transmitting device 10 and a wireless power receiving device 20. The load 2 is connected to the wireless power receiving device 20.

The wireless power transmission system 1 is a system used for power transmission to, e.g., a moving body such as an electric vehicle (EV) or a hybrid vehicle (HV) that utilizes power from a secondary battery. In this case, the wireless power transmitting device 10 is mounted in power transmission facility installed on the ground, and the wireless power receiving device 20 is mounted on a vehicle body. Hereinafter, descriptions will be made assuming that the wireless power transmission system 1 is provided for power transmission to an electric vehicle.

As illustrated in FIG. 1, the wireless power transmitting device 10 includes a DC power supply 11, a drive circuit 12, a control circuit 13, a receiver 14, a power transmitting coil L1, and a power-transmission-side capacitor C1.

The DC power supply 11 plays a role of supplying a DC power to the drive circuit 12. The DC power supply 11 is not particularly limited in type as long as it can supply a DC power. For example, a DC power supply obtained by rectifying and smoothing a commercial AC power supply, a secondary battery, a DC power supply that outputs power of photovoltaic power generation, a switching power supply such as a switching converter, and the like can be suitably used as the DC power supply 11.

The drive circuit 12 is a conversion circuit that converts a DC voltage supplied from the DC power supply 11 into an AC voltage and is constituted by a switching circuit (full-bridge circuit, not illustrated) having four switching elements that are bridge-connected to each other. The drive circuit 12 plays a role of supplying an AC current to the power transmitting coil L1.

The control circuit 13 is a circuit that controls the operation of the drive circuit 12 such that the frequency of the AC current to be supplied to the power transmitting coil L1 becomes equal to a predetermined power transmission frequency fp. When the drive circuit 12 is, e.g., the above-mentioned full-bridge circuit, the control circuit 13 generates a control signal for each of the switching elements constituting the full-bridge circuit such that the frequency of the AC current to be supplied to the power transmitting coil L1 becomes equal to the predetermined power transmission frequency fp. A concrete value of the power transmission frequency fp is set to, e.g., 20 kHz to 200 kHz.

The receiver 14 is a communication device configured to receive an arbitrary signal from a transmitter 70 provided in the wireless power receiving device 20. Communication between the receiver 14 and the transmitter 70 may be achieved by short-range wireless communication such as Bluetooth® or wireless LAN such as Wi-Fi®. Signals that the receiver 14 receives from the transmitter 70 include a result signal R of a leakage detector 30 to be described later. The result signal represents a detection result on whether there is a leakage.

When receiving the result signal R, the receiver 14 outputs the received result signal R to the control circuit 13. When the result signal R from the receiver 14 represents that the leakage detector 30 detects a leakage, the control circuit 13 stops the operation of the drive circuit 12. Specifically, when the drive circuit 12 is, e.g., the above-mentioned full-bridge circuit, the control circuit 13 turns OFF all the switching elements constituting the full-bridge circuit. As a result, power transmission operation is stopped, thus making it possible to prevent a secondary fault of the wireless power transmission system 1 due to the leakage.

The power transmitting coil L1 and the power-transmission-side capacitor C1 are connected in series between a one-side terminal and the other-side terminal on the output side (AC side) of the drive circuit 12 to constitute a resonance circuit. The resonance circuit has a resonance frequency having a value identical or close to that of the above-mentioned power transmission frequency fp and plays a role of generating an AC magnetic field based on the AC current supplied from the drive circuit 12. The power-transmission-side capacitor C1 and the power transmitting coil L1 may be connected in parallel between the one-side terminal and the other-side terminal on the output side of the drive circuit 12.

The power transmitting coil L1 is a spiral coil formed by a litz wire which is obtained by twisting about 2000 insulated copper wires each having a diameter of 0.1 mm and is wound in a planar shape by several turns to several tens of turns. The power transmitting coil L1 is disposed in the ground or in the vicinity of the ground surface. When the AC current is supplied from the drive circuit 12 to the power transmitting coil L1, an AC magnetic field is generated by the supplied AC current. The AC magnetic field generates an electromotive force in a power receiving coil L2 to be described later by mutual inductance between the power transmitting coil L1 and the power receiving coil L2 (to be described hereafter), whereby power transmission is achieved.

As illustrated in FIG. 1, the wireless power receiving device 20 includes a power receiving coil L2, power-receiving-side capacitors C2 and C3, a rectifying circuit 22, bypass capacitors C4 to C6, a leakage detector 30, an alarm 60 and a transmitter 70.

The power receiving coil L2 and power-receiving-side capacitor C2 are connected in series between a one-side terminal and the other-side terminal on the input side (AC side) of the rectifying circuit 22. The power-receiving-side capacitor C3 is connected in parallel with the power receiving coil L2 and the power-receiving-side capacitor C2. As a result, the power receiving coil L2 and the power-receiving-side capacitors C2 and C3 constitute a resonance circuit. The resonance frequency of the resonance circuit is also set to a value identical or close to that of the above-mentioned power transmission frequency fp. The resonance circuit plays a role as a power receiving section that receives an AC power transmitted from the power transmitting coil L1 by wireless.

Like the power transmitting coil L1, the power receiving coil L2 is a spiral coil formed by a litz wire which is obtained by twisting about 2000 insulated copper wires each having a diameter of 0.1 mm and is wound in a planar shape by several turns to several tens of turns. On the other hand, unlike the power transmitting coil L, the power receiving coil L2 is disposed, e.g., at the lower part of the vehicle body of the electric vehicle. When a magnetic flux generated by the power transmitting coil L1 interlinks the power receiving coil L2, an AC current flows in the power receiving coil L2 by electromagnetic induction. The AC current is converted into a DC current by the rectifying circuit 22 and is then supplied to the load 2. This allows a DC power to be supplied to the load 2.

The rectifying circuit 22 is a conversion circuit that converts an AC voltage supplied from the power receiving coil L2 into a DC voltage. Specifically, the rectifying circuit 22 has a function of converting an AC current supplied from the power receiving coil L2 into a DC current and supplying the DC current to the load 2 and is constituted by a bridge circuit (not illustrated) having a plurality of diodes that are bridge-connected to each other.

The bypass capacitors C4 to C6 are each a capacitor installed for the purpose of reducing a variation in the output voltage (DC voltage) of the rectifying circuit 22. The bypass capacitor C4 is connected between a high-voltage-side terminal and a low-voltage-side terminal of the output side (DC side) of the rectifying circuit 22, the bypass capacitor C5 is connected between the high-voltage-side terminal of the output side of the rectifying circuit 22 and a ground line, and the bypass capacitor C6 is connected between the low-voltage-side terminal of the output side of the rectifying circuit 22 and the ground line.

Although not illustrated, the load 2 includes a charger and a battery. The charger is a circuit having a function of charging the battery based on the DC power output from the rectifying circuit 22. The charging is executed by, e.g., constant-voltage and constant-current charging (CVCC charging). The battery is not particularly limited in type as long as it can store an electric power. For example, a secondary battery (lithium-ion battery, lithium-polymer battery, nickel battery, etc.) and a capacitive element (electric double layer capacitor, etc.) can be suitably used as a battery constituting the load 2.

The leakage detector 30 is a device for detecting the leakage from a power line in the wireless power receiving device 20. Specifically, as illustrated in FIG. 1, the leakage detector 30 includes an average voltage detection circuit 40 and a leakage detection circuit 50. The average voltage detection circuit 40 detects an average voltage A of voltages corresponding to a potential difference $V_L$-$V_G$ between the low-voltage-side terminal (voltage $V_L$) on the output side of the rectifying circuit 22 and a metal member (MG) (voltage $V_G$) which is provided in the vicinity of the power receiving coil L2 so as to shield a magnetic flux. The leakage detection circuit 50 detects the presence/absence of the leakage based on the average voltage A detected by the average voltage detection circuit 40 and outputs the result signal R representing the result of the detection. The metal member MG is, e.g., a metal shield plate and is grounded as illustrated in FIG. 1. Although the low-voltage-side terminal on the output side of the rectifying circuit 22 is connected to the average voltage detection circuit 40 in the example of FIG. 1, the high-voltage-side terminal on the output side of the rectifying circuit 22 may be connected to the average voltage detection circuit 40 in place of the low-voltage-side terminal. In this case, the average voltage detection circuit 40 detects the average voltage of voltages corresponding to a potential difference between the high-voltage-side terminal on the output side of the rectifying circuit 22 and the metal member MG. Details of the leakage detector 30 will be descried later.

The alarm 60 is a device that makes a notification to a user or an external device in response to the detection of the leakage by the leakage detector 30 (that is, in response to supply of the result signal R representing the detection of the leakage from the leakage detector 30). Concrete examples of devices for issuing a notification to a user include, e.g., a bell that notifies the user, by alarm sound, of the leakage having been detected, and a lamp that notifies the user, by light, of the leakage having been detected. Examples of external devices as a target of notification by the alarm 60 include, e.g., various systems (including the charger as the above-mentioned load 2) in the vehicle body.

The transmitter 70 is a circuit that transfers the result signal R supplied from the leakage detector 30 to the receiver 14. As described above, the receiver 14 is configured to output the result signal R received from the transmitter 70 to the control circuit 13, and the control circuit 13 stops the operation of the drive circuit 12 when the result signal R of the leakage detector 30 input thereto from the receiver 14 indicates the detection of the leakage. Thus, the result signal R of the leakage detector 30 indicating that the leakage has been detected can be referred to as a stop signal for urging the wireless power transmitting device 10 to stop its power transmission operation.

Hereinafter, the specific configuration of the leakage detector 30 will be described in detail with reference to FIGS. 2A to 2E, FIGS. 3A to 3F, and FIGS. 4A and 4B.

FIGS. 2A to 2E are views each illustrating an example of the internal configuration of the average voltage detection circuit 40 illustrated in FIG. 1. FIG. 3A is a view illustrating an example of the internal configuration of a resistance voltage-dividing circuit 41 or 46 illustrated in FIG. 2, FIG. 3B is a view illustrating an example of the internal configuration of an averaging circuit 42, 45, or 49 illustrated in FIG. 2, FIG. 3C is a view illustrating an example of the internal configuration of a capacitance voltage-dividing circuit 43 illustrated in FIG. 2, FIGS. 3D and 3E are views each illustrating an example of the internal configuration of a rectifying circuit 44 or 48 illustrated in FIG. 2, and FIG. 3F is a view illustrating the internal configuration of a differentiation circuit 47 illustrated in FIG. 2.

Figure 2A:
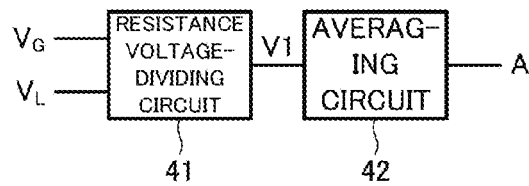
FIGS. 2A to 2E are views each illustrating an example of the internal configuration of the average voltage detection circuit 40 illustrated in FIG. 1.
Figure 3A:
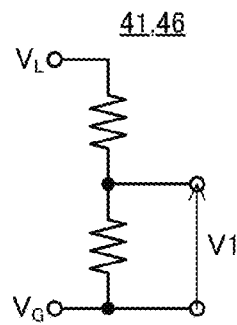
FIG. 3A is a view illustrating an example of the internal configuration of a resistance voltage-dividing circuit 41 or 46 illustrated in FIG. 2.
Figure 3B:
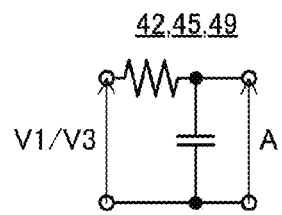
FIG. 3B is a view illustrating an example of the internal configuration of an averaging circuit 42, 45, or 49 illustrated in FIG. 2.
Figure 3C:
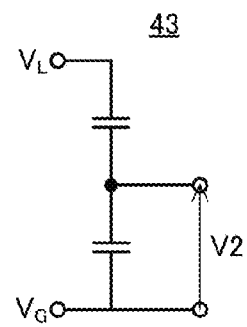
FIG. 3C is a view illustrating an example of the internal configuration of a capacitance voltage-dividing circuit 43 illustrated in FIG. 2.
Figure 3D:
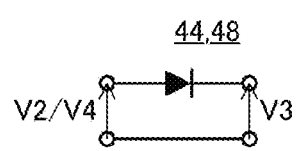
FIGS. 3D and 3E are views each illustrating an example of the internal configuration of a rectifying circuit 44 or 48 illustrated in FIG. 2.
Figure 3E:
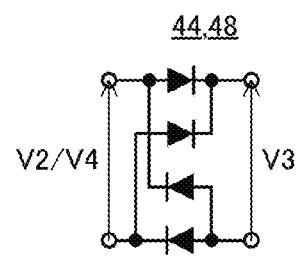
Figure 3F:
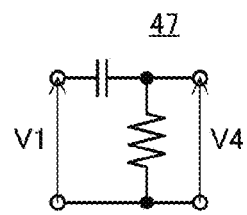
FIG. 3F is a view illustrating the internal configuration of a differentiation circuit 47 illustrated in FIG. 2.

The average voltage detection circuit 40 of a first example illustrated in FIG. 2A is composed of the resistance voltage-dividing circuit 41 (first resistance voltage-dividing circuit) and the averaging circuit 42 (first averaging circuit).

The resistance voltage-dividing circuit 41 is a circuit that generates a voltage V1 by performing resistance voltage division of the above-mentioned potential difference $V_L-V_G$ and includes two resistive elements connected in series between the input terminal of the voltage $V_L$ and the input terminal of the voltage $V_G$ as illustrated in FIG. 3A. The voltage V1 is the end-to-end voltage of one of the two resistive elements that is closer to the input terminal of the voltage $V_G$. When the two resistive elements have the same resistance value, $V1=(V_G-V_L)/2$ is satisfied.

The averaging circuit 42 is a circuit that detects the average voltage A of the output voltages V1 of the resistance voltage-dividing circuit 41 and is constituted by a low-pass filter composed of a capacitor and a resistive element. The averaging circuit 42 according to the present embodiment is configured to detect the average voltage A using averaging action of the low-pass filter.

The average voltage detection circuit 40 of the first example allows the detection of the leakage in a DC line (specifically, a wiring connected to the output terminal of the rectifying circuit 22) of the wireless power receiving device 20. Further, since the DC line is connected to the load 2, the average voltage detection circuit 40 of the first example allows the detection of the leakage even during stoppage of power transmission.

Figure 2B:
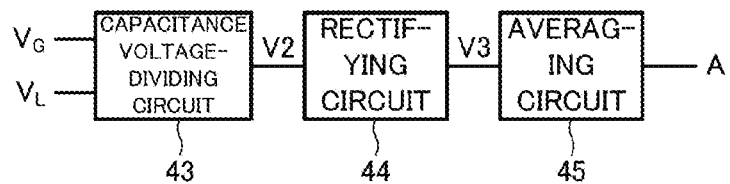

The average voltage detection circuit 40 of a second example illustrated in FIG. 2B is composed of the capacitance voltage-dividing circuit 43, rectifying circuit 44 (first rectifying circuit), and averaging circuit 45 (second averaging circuit).

The capacitance voltage-dividing circuit 43 is a circuit that generates a voltage V2 by performing capacitance voltage division of the above-mentioned potential difference $V_L-V_G$ and includes two capacitive elements connected in series between the input terminal of the voltage $V_L$ and the input terminal of the voltage $V_G$ as illustrated in FIG. 3C. The voltage V2 is the end-to-end voltage of one of the two capacitive elements that is closer to the input terminal of the voltage $V_G$.

The rectifying circuit 44 is a circuit that generates a voltage V3 by rectifying the output voltage V2 of the capacitance voltage-dividing circuit 43 and includes one or more diodes as illustrated in FIG. 3D or 3E. Specifically, the rectifying circuit 44 illustrated in FIG. 3D includes only one diode whose anode and cathode are connected respectively to a high-voltage-side input terminal and a high-voltage-side output terminal. On the other hand, the rectifying circuit 44 illustrated in FIG. 3E includes a diode whose anode and cathode are connected respectively to a high-voltage-side input terminal and a high-voltage-side output terminal, a diode whose anode and cathode are connected respectively to a low-voltage-side input terminal and the high-voltage-side output terminal, a diode whose anode and cathode are connected respectively to a low-voltage-side output terminal and the high-voltage-side input terminal, and a diode whose anode and cathode are connected respectively to the low-voltage-side output terminal and the low-voltage-side input terminal.

The averaging circuit 45 is a circuit that detects the average voltage A of the output voltages V3 of the rectifying circuit 44 and is constituted by a low-pass filter similar to that of the averaging circuit 42 as illustrated in FIG. 3B. The averaging circuit 45 according to the present embodiment is configured to detect the average voltage A using averaging action of the low-pass filter.

The average voltage detection circuit 40 of the second example allows the detection of the leakage in an AC line (specifically, a wiring connected to the input terminal of the rectifying circuit 22) of the wireless power receiving device 20. This is achieved by utilizing a phenomenon that the potential of the metal member MG varies when the AC current flowing in the AC line leaks into the metal member MG. The AC current can flow in the AC line only when the wireless power transmission system 1 is in a power transmission state or in a weak excitation state, so that the average voltage detection circuit 40 of the second example can detect the leakage in the AC line only in the power transmission or weak excitation state.

Figure 2C:
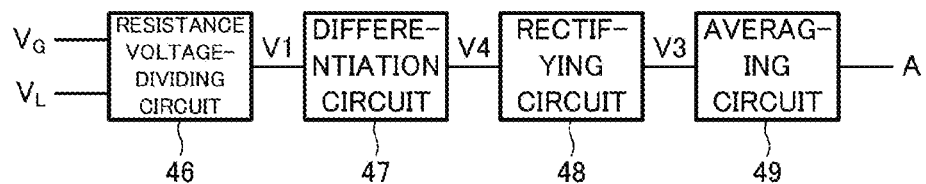

The average voltage detection circuit 40 of a third example illustrated in FIG. 2C is composed of the resistance voltage-dividing circuit 46 (second resistance voltage-dividing circuit), differentiation circuit 47, rectifying circuit 48 (second rectifying circuit), and averaging circuit 49 (third averaging circuit).

The resistance voltage-dividing circuit 46 is a circuit that generates the voltage V1 by performing resistance voltage division of the above-mentioned potential difference $V_L-V_G$ and is constituted by a circuit similar to that of the resistance voltage-dividing circuit 41 as illustrated in FIG. 3A. Specifically, the resistance voltage-dividing circuit 46 includes two resistive elements connected in series between the input terminal of the voltage $V_L$ and the input terminal of the voltage $V_G$, and the voltage V1 is the end-to-end voltage of one of the two resistive elements that is closer to the input terminal of the voltage $V_G$.

The differentiation circuit 47 is a circuit that generates a voltage V4 by differentiating the output voltage V1 of the resistance voltage-dividing circuit 46 and is constituted by a high-pass filter composed of a capacitor and a resistive element as illustrated in FIG. 3F.

The rectifying circuit 48 is a circuit that generates the voltage V3 by rectifying the output voltage V4 of the differentiation circuit 47 and has a circuit configuration similar to that of the rectifying circuit 44 as illustrated in FIG. 3D or 3E.

The averaging circuit 49 is a circuit that detects the average voltage A of the output voltages V3 of the rectifying circuit 48 and is constituted by a low-pass filter similar to those of the averaging circuits 42 and 45 as illustrated in FIG. 3B. The averaging circuit 49 according to the present embodiment is configured to detect the average voltage A using averaging action of the low-pass filter.

The average voltage detection circuit 40 of the third example also allows the detection of the leakage in the AC line (specifically, a wiring connected to the input terminal of the rectifying circuit 22) of the wireless power receiving device 20. This is also achieved by utilizing the phenomenon that the potential of the metal member MG varies when the AC current flowing in the AC line leaks into the metal member MG. As in the second example, the average voltage detection circuit 40 of the third example can detect the leakage in the AC line only in the power transmission or weak excitation state.

Figure 2D:
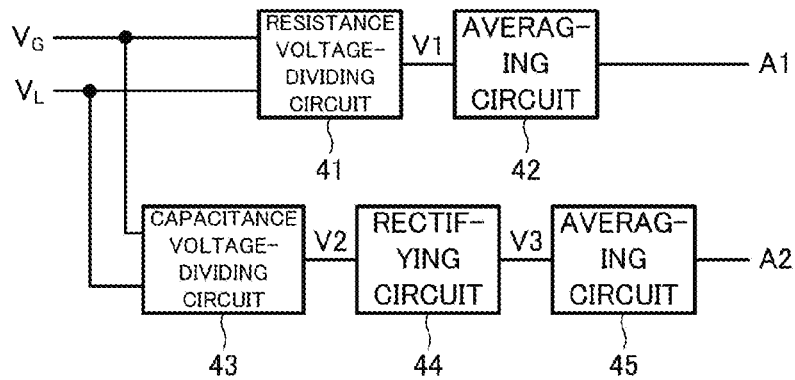

The average voltage detection circuit 40 of a fourth example illustrated in FIG. 2D has a configuration in which the circuit of the first example illustrated in FIG. 2A and the circuit of the second example illustrated in FIG. 2B are connected in parallel to thereby output two average voltages A1 and A2. As described above, the circuit of the first example can detect the leakage in the DC line of the wireless power receiving device 20, and the circuit of the second example can detect the leakage in the AC line of the wireless power receiving device 20, so that the average voltage detection circuit 40 of the fourth example can detect the leakage in both the DC and AC lines. Thus, it is substantially possible to detect the leakage occurring at all places in the wireless power receiving device 20.

Figure 2E:
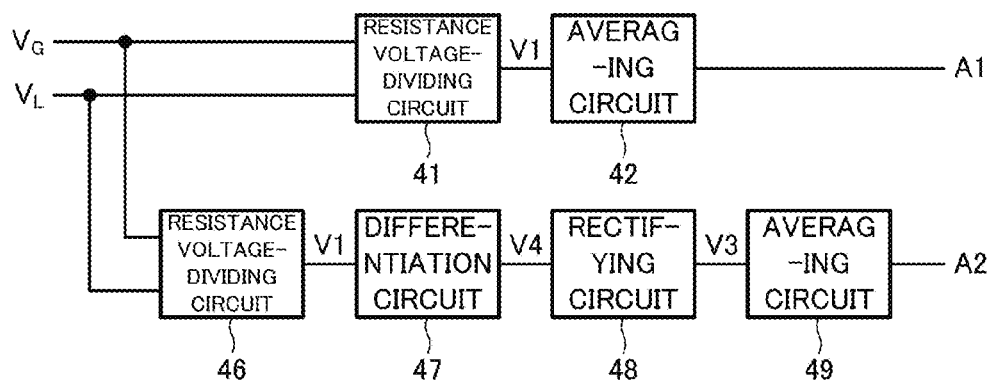

The average voltage detection circuit 40 of a fifth example illustrated in FIG. 2E has a configuration in which the circuit of the first example illustrated in FIG. 2A and the circuit of the third example illustrated in FIG. 2C are connected in parallel to thereby output two average voltages A1 and A2. As described above, the circuit of the first example can detect the leakage in the DC line of the wireless power receiving device 20, and the circuit of the third example can detect the leakage in the AC line of the wireless power receiving device 20, so that the average voltage detection circuit 40 of the fifth example can also detect the leakage in both the DC and AC lines. Thus, it is substantially possible to detect the leakage occurring at all places in the wireless power receiving device 20.

Figure 4A:
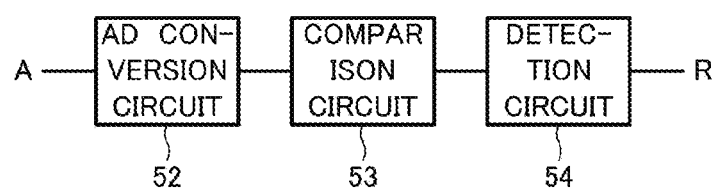
FIGS. 4A and 4B are views each illustrating an example of the internal configuration of the leakage detection circuit 50 illustrated in FIG. 1.
Figure 4B:
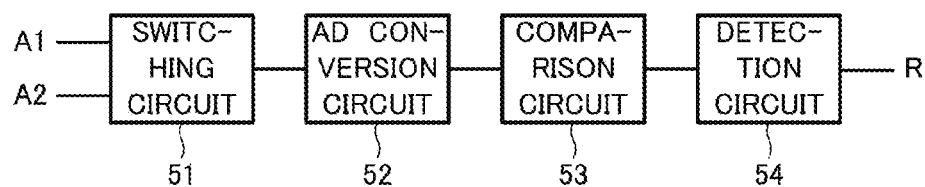

FIGS. 4A and 4B are views each illustrating an example of the internal configuration of the leakage detection circuit 50 illustrated in FIG. 1.

The leakage detection circuit 50 illustrated in FIG. 4A is used together with the average voltage detection circuit 40 illustrated in FIGS. 2A to 2C and includes an AD conversion circuit 52, a comparison circuit 53, and a detection circuit 54.

The AD conversion circuit 52 is a circuit that converts the average voltage A input thereto from the average voltage detection circuit 40 into a digital signal. Specifically, the AD conversion circuit 52 samples the average voltage A with a predetermined sampling frequency and then quantizes the sampling result to thereby generate a digital signal. The comparison circuit 53 is a circuit that compares the average voltage A after conversion performed by the AD conversion circuit 52 with a threshold value. The threshold value is previously stored in, e.g., the comparison circuit 53. The detection circuit 54 is a circuit that detects the presence/absence of the leakage based on a result from the comparison circuit 53. The output of the detection circuit 54 is supplied to the alarm 60 and transmitter 70 illustrated in FIG. 1 as the result signal R.

The threshold value that the comparison circuit 53 uses for comparison may include a plurality of threshold values having different voltage values. In this case, the comparison circuit 53 outputs a plurality of comparison results corresponding respectively to the plurality of threshold values. In general, the concrete value of the average voltage A differs according to a place where the leakage occurs. Thus, by preparing the plurality of threshold values, it is possible to specify a place where the leakage has occurred based on the plurality of comparison results output from the comparison circuit 53.

Further, the threshold value to be stored in the comparison circuit 53 may be changeable to an arbitrary value. In this case, while changing the threshold value, the comparison circuit 53 may perform comparison with respect to the respective threshold values. This also allows a place where the leakage has occurred to be specified based on the plurality of comparison results output from the comparison circuit 53.

The AD conversion circuit 52 in the leakage detection circuit 50 may be omitted, and the average voltage A input from the average voltage detection circuit 40 may be supplied directly to the comparison circuit 53. In this case, the comparison circuit 53 needs to be constituted by a circuit that can compare the average voltage A as an analog signal and a threshold value.

Further, in place of processing using the comparison circuit 53 and the detection circuit 54, another method may be used to detect the presence/absence of the leakage. For example, a lookup table that relates the value of the average voltage A to the presence/absence of the leakage may be prepared. In this case, when the average voltage A is output from the AD conversion circuit 52, the presence/absence of the leakage corresponding to the output average voltage A is read from the lookup table, whereby the presence/absence of the leakage can be detected.

The leakage detection circuit 50 illustrated in FIG. 4B is used together with the average voltage detection circuit 40 illustrated in FIG. 2D or 2E and differs from the leakage detection circuit 50 illustrated in FIG. 4A in that it has a switching circuit 51 at a stage preceding the AD conversion circuit 52. Other configurations are the same as those of the leakage detection circuit 50 illustrated in FIG. 4A, so only the switching circuit 51 will be described below.

When used together with the average voltage detection circuit 40 illustrated in FIG. 2D, the switching circuit 51 is a circuit (first switching circuit) that switches between the operation of detecting the presence/absence of the leakage based on the average voltage A1 output from the averaging circuit 42 and the operation of detecting the presence/absence of the leakage based on the average voltage A2 output from the averaging circuit 45. On the other hand, when used together with the average voltage detection circuit 40 illustrated in FIG. 2E, the switching circuit 51 is a circuit (second switching circuit) that switches between the operation of detecting the presence/absence of the leakage based on the average voltage A1 output from the averaging circuit 42 and the operation of detecting the presence/absence of the leakage based on the average voltage A2 output from the averaging circuit 49. In either case, the leakage detection circuit 50 can detect the leakage in the DC line of the wireless power receiving device 20 by performing the operation of detecting the presence/absence of the leakage based on the average voltage A1 and can detect the leakage in the AC line of the wireless power receiving device 20 by performing the operation of detecting the presence/absence of the leakage based on the average voltage A2. Thus, it is substantially possible to detect the leakage occurring at all places in the wireless power receiving device 20.

As described above, according to the present embodiment, the leakage is detected based on the average voltage A of the voltages V1 corresponding to the potential difference $V_L-V_G$, so that it is possible to suppress erroneous detection due to noise to thereby detect the leakage with high accuracy. Further, devising the circuit configuration in the leakage detection circuit 50 makes it substantially possible to detect the leakage occurring at all places in the wireless power receiving device 20. Further, using a plurality of threshold values makes it possible to specify a place where the leakage has occurred.

In the above-described embodiment, the leakage detection circuit 50 illustrated in FIG. 4A is used together with the average voltage detection circuit 40 illustrated in FIGS. 2A to 2C; however, it may be used together with the average voltage detection circuit 40 illustrated in FIG. 2D or 2E. In this case, the leakage detector 30 is provided with the leakage detection circuit 50 illustrated in FIG. 4A for each of the two average voltages A1 and A2 output from the average voltage detection circuit 40.

Figure 5:
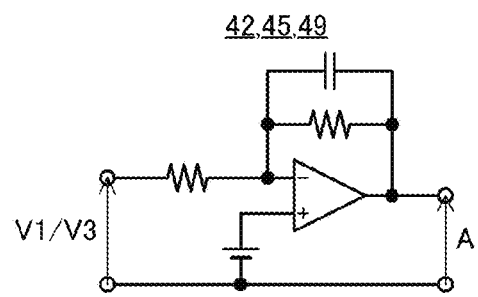
FIG. 5 is a view illustrating an another example of the internal configuration of an averaging circuit 42, 45, or 49 illustrated in FIG. 2.

Further in the above-described embodiment, the averaging circuits 42, 45, and 49 are each constituted by the low-pass filter; however, they may each be constituted by any other types of circuits as long as they can detect the average voltage of voltages input thereto. Examples of such circuits include an FIR (Finite Impulse Response) type digital filter and a circuit (integration circuit) using an operation amplifier as illustrated in FIG. 5. When the FIR type digital filter is used as the averaging circuits 42, 45, and 49, the AD conversion circuit 52 constituting the leakage detection circuit 50 is omitted.

Figure 6:
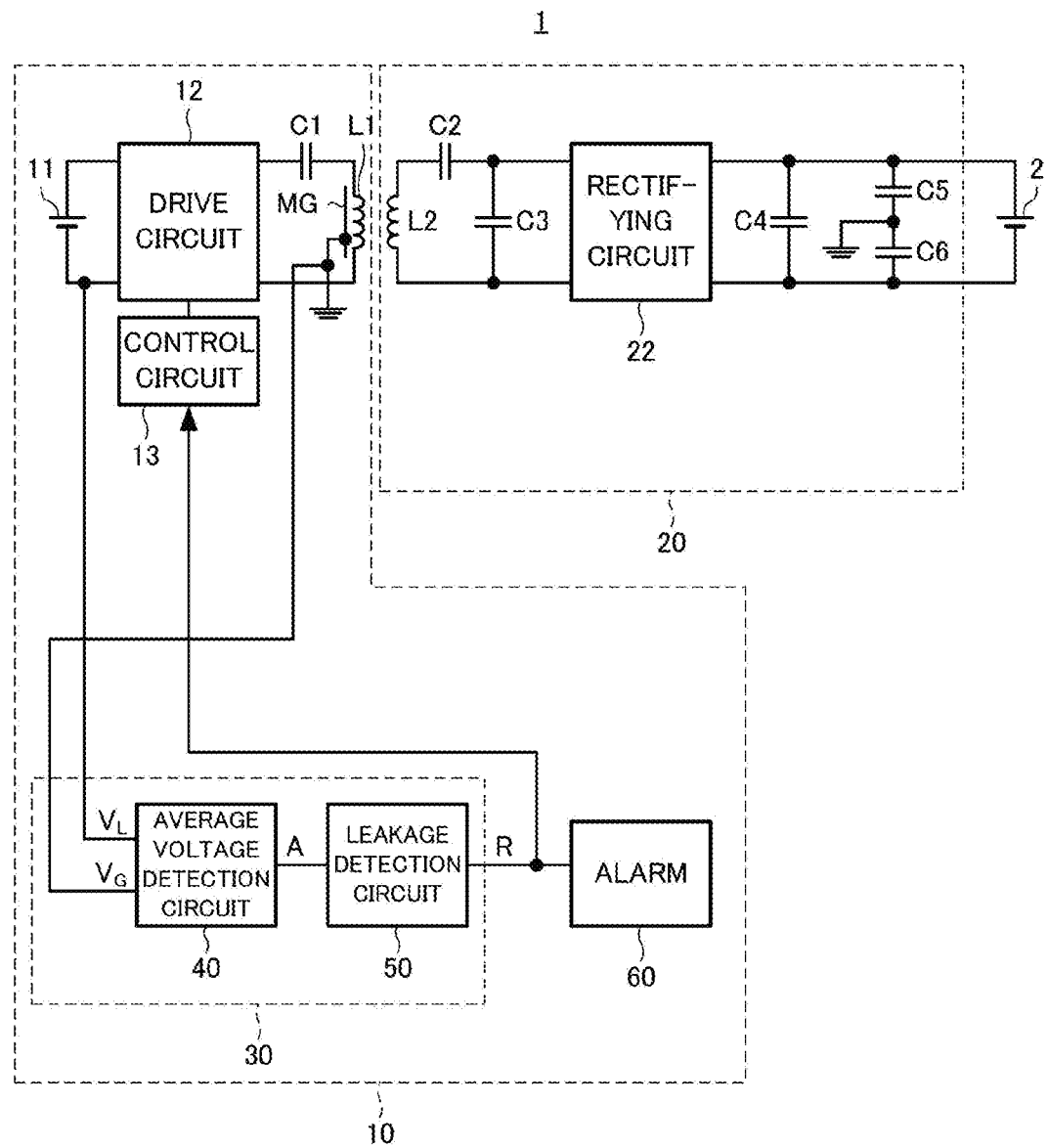
FIG. 6 is a view illustrating the configuration of the wireless power transmission system 1 according to a second embodiment of the present invention and the load 2 connected to the wireless power transmission system 1.

FIG. 6 is a view illustrating the configuration of the wireless power transmission system 1 according to a second embodiment of the present invention and the load 2 connected to the wireless power transmission system 1. The wireless power transmission system 1 according to the second embodiment differs from the wireless power transmission system 1 according to the first embodiment in that the leakage detector 30 and alarm 60 are provided in the wireless power transmitting device 10. Hereinafter, the same reference numerals are given to the same components as in the first embodiment, and descriptions will be made focusing on the differences from the first embodiment.

The average voltage detection circuit 40 according to the present embodiment is configured to detect the average voltage A of voltages corresponding to a potential difference $V_L-V_G$ between the low-voltage-side terminal (voltage $V_L$) on the input side of the drive circuit 12 and the metal member (MG) (voltage $V_G$). The metal member MG according to the present embodiment is provided in the vicinity of the power transmitting coil L1 so as to shield a magnetic flux. Other configurations are the same as those of the average voltage detection circuit 40 according to the first embodiment. As in the first embodiment, the average voltage detection circuit 40 may be configured to detect the average voltage A of voltages corresponding to the potential difference between the high-voltage-side terminal on the input side of the drive circuit 12 and the metal member MG.

The electric leakage detection circuit 50 and the alarm 60 have the same configurations as the electric leakage detection circuit 50 and the alarm 60 according to the first embodiment, respectively. That is, the electric leakage detection circuit 50 detects presence/absence of the leakage based on the average voltage A detected by the average voltage detection circuit 40 and outputs the result signal R representing the detection result. The alarm 60 makes a notification to a user or an external device in response to the detection of the leakage by the leakage detector 30.

In the present embodiment, the control circuit 13 and the leakage detector 30 are provided in the same device, so that the result signal R is directly supplied from the leakage detector 30 to the control circuit 13 not through the transmitter 70 and receiver 14 illustrated in FIG. 1. The control circuit 13 receiving the result signal R performs the same operation as that in the first embodiment.

As described above, also according to the present embodiment, the leakage is detected based on the average voltage A of the voltages V1 corresponding to the potential difference $V_L-V_G$, so that it is possible to suppress erroneous detection due to noise to thereby detect the leakage with high accuracy. Further, as in the first embodiment, devising the circuit configuration in the leakage detection circuit 50 makes it substantially possible to detect the leakage occurring at all places in the wireless power receiving device 20, and using a plurality of threshold values makes it possible to specify a place where the leakage has occurred.

It is apparent that the present invention is not limited to the above embodiments, but may be modified and changed without departing from the scope and spirit of the invention.

For example, in the above respective embodiments, a configuration in which the leakage detector 30 is provided in the wireless power receiving device 20, and a configuration in which the leakage detector 30 is provided in the wireless power transmitting device 10 have been described. However, the leakage detector 30 may be provided both in the wireless power receiving device 20 and wireless power transmitting device 10. In this case, it is preferable to configure the wireless power transmission system 1 such that operation of the drive circuit 12 is stopped, no matter which one of the leakage detectors 30 detects the leakage.

As described above, according to the present embodiment, there is provided a leakage detector provided in a device having a conversion circuit that converts a DC voltage and an AC voltage from one to the other and a grounded metal member. The leakage detector includes an average voltage detection circuit that detects the average voltage of voltages corresponding to a potential difference between a high-voltage-side terminal or a low-voltage-side terminal on the DC side of the conversion circuit and the metal member and a leakage detection circuit that detects the presence/absence of a leakage based on the average voltage detected by the average voltage detection circuit.

According to the present embodiment, the leakage is detected based on the average voltage, so that it is possible to suppress erroneous detection due to noise to thereby detect the leakage with high accuracy.

In the above leakage detector, the average voltage detection circuit may be configured to detect the average voltage of voltages corresponding to a potential difference between the low-voltage-side terminal on the DC side of the conversion circuit and the metal member. With this configuration, it is possible to detect the leakage more reliably.

In the above leakage detectors, the average voltage detection circuit may have a first resistance voltage-dividing circuit that performs resistance voltage division of the potential difference and a first averaging circuit that detects the average voltage of the output voltages of the first resistance voltage-dividing circuit. With this configuration, it is possible to detect the leakage in a DC line. Further, when the DC line is connected to a configuration serving as a power supply, it is possible to detect the leakage even during stoppage of power transmission.

In the above leakage detectors, the average voltage detection circuit may have a capacitance voltage-dividing circuit that performs capacitance voltage division of the potential difference, a first rectifying circuit that rectifies the output of the capacitance voltage-dividing circuit, and a second averaging circuit that detects the average voltage of the output voltages of the first rectifying circuit. With this configuration, it is possible to detect the leakage in an AC line in a power transmission state or in a weak excitation state.

In the above leakage detectors, the average voltage detection circuit may have a second resistance voltage-dividing circuit that performs resistance voltage division of the potential difference, a differentiation circuit that differentiates the output of the second resistance voltage-dividing circuit, a second rectifying circuit that rectifies the output of the differentiation circuit, and a third averaging circuit that detects the average voltage of the output voltages of the second rectifying circuit. Also with this configuration, it is possible to detect the leakage in the AC line in a power transmission state or in a weak excitation state.

In the above leakage detectors, the average voltage detection circuit may have a capacitance voltage-dividing circuit that performs capacitance voltage division of the potential difference, a first rectifying circuit that rectifies the output of the capacitance voltage-dividing circuit, and a second averaging circuit that detects the average voltage of the output voltages of the first rectifying circuit, and the leakage detection circuit may include a first switching circuit that switches between the operation of detecting the presence/absence of the leakage based on the average voltage output from the first averaging circuit and the operation of detecting the presence/absence of the leakage based on the average voltage output from the second averaging circuit. With this configuration, the leakage occurring in both the DC and AC lines can be detected, thus making it substantially possible to detect the leakage occurring at all places.

In the above leakage detectors, the average voltage detection circuit may have a second resistance voltage-dividing circuit that performs resistance voltage division of the potential difference, a differentiation circuit that differentiates the output of the second resistance voltage-dividing circuit, a second rectifying circuit that rectifies the output of the differentiation circuit, and a third averaging circuit that detects the average voltage of the output voltages of the second rectifying circuit, and the leakage detection circuit may include a second switching circuit that switches between the operation of detecting the presence/absence of the leakage based on the average voltage output from the first averaging circuit and the operation of detecting the presence/absence of the leakage based on the average voltage output from the third averaging circuit. Also with this configuration, the leakage occurring in both the DC and AC lines can be detected, thus making it substantially possible to detect the leakage occurring at all places.

The first averaging circuit can be configured to detect the average voltage of the output voltages of the first resistance voltage-dividing circuit using averaging action of a low-pass filter, the second averaging circuit can be configured to detect the average voltage of the output voltages of the first rectifying circuit using averaging action of a low-pass filter, and the third averaging circuit can be configured to detect the average voltage of the output voltages of the second rectifying circuit using averaging action of a low-pass filter.

In the above leakage detectors, the leakage detection circuit may include a comparison circuit that compares the average voltage and a threshold value and a detection circuit that detects the presence/absence of the leakage based on a result from the comparison circuit, and the threshold value may include a plurality of threshold values having different voltage values. With this configuration, it is possible to specify a place where the leakage has occurred by performing comparison using the plurality of threshold values.

In the above leakage detectors, the leakage detection circuit may include a comparison circuit that compares the average voltage and a threshold value and a detection circuit that detects the presence/absence of the leakage based on a result from the comparison circuit, and the threshold value may be changeable to an arbitrary value. With this configuration, it is possible to specify a place where the leakage has occurred by performing comparison while changing the threshold value.

In the above leakage detectors, the leakage detection circuit may include an AD conversion circuit that converts the average voltage into a digital signal and a detection circuit that detects the presence/absence of the leakage based on the average voltage after conversion performed by the AD conversion circuit. With this configuration, it is possible to detect the presence/absence of the leakage based on the average voltage after conversion performed by the AD conversion circuit.

A wireless power transmitting device according to the present embodiment includes any one of the above leakage detectors, a drive circuit serving as the conversion circuit that converts a DC voltage into an AC voltage, the metal member, a power transmitting coil that generates an AC magnetic field based on the AC voltage supplied from the drive circuit, and a control circuit that stops the operation of the drive circuit in response to the detection of the leakage by the leakage detection circuit. With this configuration, power transmission operation can be stopped when the leakage occurs, thus making it possible to prevent a secondary fault.

A wireless power transmitting device according to another aspect of the present embodiment includes any one of the above leakage detectors, a drive circuit serving as the conversion circuit that converts a DC voltage into an AC voltage, the metal member, a power transmitting coil that generates an AC magnetic field based on the AC voltage supplied from the drive circuit, and an alarm that executes notification to a user or an external device in response to the detection of the leakage by the leakage detection circuit. With this configuration, it is possible to stop power transmission operation and promote repair when the leakage occurs, whereby a secondary fault can be prevented.

A wireless power receiving device according to the present embodiment includes any one of the above leakage detectors, a power receiving coil that receives an AC magnetic field and generates an AC voltage based on the AC magnetic field, a rectifying circuit serving as the conversion circuit that converts the AC voltage generated by the power receiving coil into a DC voltage, the metal member, and a transmitter that transmits, in response to the detection of the leakage by the leakage detection circuit, a stop signal for urging a wireless power transmitting device that generates the AC magnetic field to stop its power transmission operation. With this configuration, power transmission operation can be stopped when the leakage occurs, thus making it possible to prevent a secondary fault.

A wireless power receiving device according to another aspect of the present embodiment includes any one of the above leakage detectors, a power receiving coil that receives an AC magnetic field and generates an AC voltage based on the AC magnetic field, a rectifying circuit serving as the conversion circuit that converts the AC voltage generated by the power receiving coil into a DC voltage, the metal member, and an alarm that executes notification to a user or an external device in response to the detection of the leakage by the leakage detection circuit. With this configuration, it is possible to stop power transmission operation and promote repair when the leakage occurs, whereby a secondary fault can be prevented.

In the above wireless power transmitting devices and wireless power receiving devices, the metal member may be a metal shield plate that is disposed in the vicinity of the power transmitting coil so as to shield a leakage magnetic flux.

A wireless power transmission system according to the present embodiment includes a wireless power transmitting device and a wireless power receiving device, wherein the wireless power transmitting device is any one of the above wireless power transmitting devices.

A wireless power transmission system according to another aspect of the present embodiment includes a wireless power transmitting device and a wireless power receiving device, wherein the wireless power receiving device is any one of the above wireless power receiving devices.

A wireless power transmission system according to still another aspect of the present embodiment includes a wireless power transmitting device and a wireless power receiving device, wherein the wireless power transmitting device is any one of the above wireless power transmitting devices, and the wireless power receiving device is any one of the above wireless power receiving devices.

According to the present embodiment, the leakage is detected based on the average voltage, so that it is possible to suppress erroneous detection due to noise to thereby detect the leakage with high accuracy.

What is claimed is:

1. A leakage detector provided in a device having a conversion circuit that converts a DC voltage and an AC voltage from one to the other and a grounded metal member, comprising:
   an average voltage detection circuit that detects the average voltage of voltages corresponding to a potential difference between a high-voltage-side terminal or a low-voltage-side terminal on the DC side of the conversion circuit and the metal member; and
   a leakage detection circuit that detects the presence/absence of a leakage based on the average voltage detected by the average voltage detection circuit.

2. The leakage detector as claimed in claim 1, wherein, the average voltage detection circuit is configured to detect the average voltage of voltages corresponding to a potential difference between the low-voltage-side terminal on the DC side of the conversion circuit and the metal member.

3. The leakage detector as claimed in claim 1, wherein the average voltage detection circuit comprises:
   a first resistance voltage-dividing circuit that performs resistance voltage division of the potential difference; and
   a first averaging circuit that detects the average voltage of the output voltages of the first resistance voltage-dividing circuit.

4. The leakage detector as claimed in claim 3, wherein the average voltage detection circuit comprises:
   a capacitance voltage-dividing circuit that performs capacitance voltage division of the potential difference;
   a first rectifying circuit that rectifies the output of the capacitance voltage-dividing circuit; and
   a second averaging circuit that detects the average voltage of the output voltages of the first rectifying circuit, and
   the leakage detection circuit includes a first switching circuit that switches between the operation of detecting the presence/absence of the leakage based on the average voltage output from the first averaging circuit and the operation of detecting the presence/absence of the leakage based on the average voltage output from the second averaging circuit.

5. The leakage detector as claimed in claim 3, wherein the average voltage detection circuit comprises:
   a second resistance voltage-dividing circuit that performs resistance voltage division of the potential difference;
   a differentiation circuit that differentiates the output of the second resistance voltage-dividing circuit;
   a second rectifying circuit that rectifies the output of the differentiation circuit; and
   a third averaging circuit that detects the average voltage of the output voltages of the second rectifying circuit, and
   the leakage detection circuit includes a second switching circuit that switches between the operation of detecting the presence/absence of the leakage based on the average voltage output from the first averaging circuit and the operation of detecting the presence/absence of the leakage based on the average voltage output from the third averaging circuit.

6. The leakage detector as claimed in claim 3, wherein the first averaging circuit is configured to detect the average voltage of the output voltages of the first resistance voltage-dividing circuit using averaging action of a low-pass filter.

7. The leakage detector as claimed in claim 1, wherein the average voltage detection circuit comprises:
   a capacitance voltage-dividing circuit that performs capacitance voltage division of the potential difference;
   a first rectifying circuit that rectifies the output of the capacitance voltage-dividing circuit; and
   a second averaging circuit that detects the average voltage of the output voltages of the first rectifying circuit.

8. The leakage detector as claimed in claim 7, wherein the second averaging circuit is configured to detect the average voltage of the output voltages of the first rectifying circuit using averaging action of a low-pass filter.

9. The leakage detector as claimed in claim 1, wherein the leakage detection circuit comprises:
   a comparison circuit that compares the average voltage and a threshold value; and
   a detection circuit that detects the presence/absence of the leakage based on a result from the comparison circuit, and
   the threshold value includes a plurality of threshold values having different voltage values.

10. The leakage detector as claimed in claim 1, wherein the leakage detection circuit comprises:
    a comparison circuit that compares the average voltage and a threshold value; and
    a detection circuit that detects the presence/absence of the leakage based on a result from the comparison circuit, and
    the threshold value is changeable to an arbitrary value.

11. The leakage detector as claimed in claim 1, wherein the leakage detection circuit comprises:
    an AD conversion circuit that converts the average voltage into a digital signal; and
    a detection circuit that detects the presence/absence of the leakage based on the average voltage after conversion performed by the AD conversion circuit.

12. The leakage detector as claimed in claim 1, wherein the average voltage detection circuit comprises:
    a second resistance voltage-dividing circuit that performs resistance voltage division of the potential difference;
    a differentiation circuit that differentiates the output of the second resistance voltage-dividing circuit;
    a second rectifying circuit that rectifies the output of the differentiation circuit; and
    a third averaging circuit that detects the average voltage of the output voltages of the second rectifying circuit.

13. The leakage detector as claimed in claim 12, wherein the third averaging circuit is configured to detect the average voltage of the output voltages of the second rectifying circuit using averaging action of a low-pass filter.

14. A wireless power transmitting device comprising:
a leakage detector;
a drive circuit that converts a DC voltage into an AC voltage;
a metal member;
a power transmitting coil that generates an AC magnetic field based on the AC voltage supplied from the drive circuit; and
a control circuit that stops the operation of the drive circuit in response to the detection of the leakage by the leakage detector, wherein
the leakage detector comprises:
- an average voltage detection circuit that detects the average voltage of voltages corresponding to a potential difference between a high-voltage-side terminal or a low-voltage-side terminal on the DC side of the drive circuit and the metal member; and
- a leakage detection circuit that detects the presence/absence of a leakage based on the average voltage detected by the average voltage detection circuit.

15. The wireless power transmitting device as claimed in claim 14, wherein the metal member is a metal shield plate that is disposed in the vicinity of the power transmitting coil so as to shield a leakage magnetic flux.

16. A wireless power transmitting device comprising:
a leakage detector,
a drive circuit that converts a DC voltage into an AC voltage,
a metal member;
a power transmitting coil that generates an AC magnetic field based on the AC voltage supplied from the drive circuit; and
an alarm that executes notification to a user or an external device in response to the detection of the leakage by the leakage detector, wherein
the leakage detector comprises:
- an average voltage detection circuit that detects the average voltage of voltages corresponding to a potential difference between a high-voltage-side terminal or a low-voltage-side terminal on the DC side of the drive circuit and the metal member; and
- a leakage detection circuit that detects the presence/absence of a leakage based on the average voltage detected by the average voltage detection circuit.

17. A wireless power receiving device comprising:
a leakage detector;
a power receiving coil that receives an AC magnetic field and generates an AC voltage based on the AC magnetic field;
a rectifying circuit that converts the AC voltage generated by the power receiving coil into a DC voltage;
a metal member; and
a transmitter that transmits, in response to the detection of the leakage by the leakage detector, a stop signal for urging a wireless power transmitting device that generates the AC magnetic field to stop its power transmission operation, wherein
the leakage detector comprises:
- an average voltage detection circuit that detects the average voltage of voltages corresponding to a potential difference between a high-voltage-side terminal or a low-voltage-side terminal on the DC side of the rectifying circuit and the metal member; and
- a leakage detection circuit that detects the presence/absence of a leakage based on the average voltage detected by the average voltage detection circuit.

18. The wireless power receiving device as claimed in claim 17, wherein the metal member is a metal shield plate that is disposed in the vicinity of the power receiving coil so as to shield a leakage magnetic flux.

19. A wireless power receiving device comprising:
a leakage detector;
a power receiving coil that receives an AC magnetic field and generates an AC voltage based on the AC magnetic field;
a rectifying circuit that converts the AC voltage generated by the power receiving coil into a DC voltage;
a metal member; and
an alarm that executes notification to a user or an external device in response to the detection of the leakage by the leakage detector, wherein
the leakage detector comprises:
- an average voltage detection circuit that detects the average voltage of voltages corresponding to a potential difference between a high-voltage-side terminal or a low-voltage-side terminal on the DC side of the rectifying circuit and the metal member; and
- a leakage detection circuit that detects the presence/absence of a leakage based on the average voltage detected by the average voltage detection circuit.

20. A wireless power transmission system comprising:
a wireless power transmitting device; and
a wireless power receiving device, wherein
the wireless power transmitting device comprises:
a leakage detector;
a drive circuit that converts a DC voltage into an AC voltage;
a metal member;
a power transmitting coil that generates an AC magnetic field based on the AC voltage supplied from the drive circuit; and
a control circuit that stops the operation of the drive circuit in response to the detection of the leakage by the leakage detector, wherein
the leakage detector comprises:
- an average voltage detection circuit that detects the average voltage of voltages corresponding to a potential difference between a high-voltage-side terminal or a low-voltage-side terminal on the DC side of the drive circuit and the metal member; and
- a leakage detection circuit that detects the presence/absence of a leakage based on the average voltage detected by the average voltage detection circuit.

21. A wireless power transmission system comprising:
a wireless power transmitting device; and
a wireless power receiving device, wherein
the wireless power receiving device comprises:
a leakage detector;
a power receiving coil that receives an AC magnetic field and generates an AC voltage based on the AC magnetic field;
a rectifying circuit that converts the AC voltage generated by the power receiving coil into a DC voltage;
a metal member; and
a transmitter that transmits, in response to the detection of the leakage by the leakage detector, a stop signal for urging a wireless power transmitting device that generates the AC magnetic field to stop its power transmission operation, wherein
the leakage detector comprises:
- an average voltage detection circuit that detects the average voltage of voltages corresponding to a potential difference between a high-voltage-side terminal or a low-voltage-side terminal on the DC side of the rectifying circuit and the metal member; and a leakage detection circuit that detects the presence/absence of a leakage based on the average voltage detected by the average voltage detection circuit.

22. A wireless power transmission system comprising:
a wireless power transmitting device; and
a wireless power receiving device, wherein
the wireless power transmitting device comprises:
   a leakage detector;
   a drive circuit that converts a DC voltage into an AC voltage;
   a metal member;
   a power transmitting coil that generates an AC magnetic field based on the AC voltage supplied from the drive circuit; and
   a control circuit that stops the operation of the drive circuit in response to the detection of the leakage by the leakage detector, wherein
   the leakage detector comprises:
      an average voltage detection circuit that detects the average voltage of voltages corresponding to a potential difference between a high-voltage-side terminal or a low-voltage-side terminal on the DC side of the drive circuit and the metal member; and
      a leakage detection circuit that detects the presence/absence of a leakage based on the average voltage detected by the average voltage detection circuit, and
the wireless power receiving device comprises:
   a leakage detector;
   a power receiving coil that receives an AC magnetic field and generates an AC voltage based on the AC magnetic field;
   a rectifying circuit that converts the AC voltage generated by the power receiving coil into a DC voltage;
   a metal member; and
   a transmitter that transmits, in response to the detection of the leakage by the leakage detector, a stop signal for urging a wireless power transmitting device that generates the AC magnetic field to stop its power transmission operation, wherein
   the leakage detector comprises:
      an average voltage detection circuit that detects the average voltage of voltages corresponding to a potential difference between a high-voltage-side terminal or a low-voltage-side terminal on the DC side of the rectifying circuit and the metal member; and
      a leakage detection circuit that detects the presence/absence of a leakage based on the average voltage detected by the average voltage detection circuit.

\* \* \* \* \*